(12) United States Patent
Yang et al.

(10) Patent No.: US 6,787,854 B1
(45) Date of Patent: Sep. 7, 2004

(54) METHOD FOR FORMING A FIN IN A FINFET DEVICE

(75) Inventors: Chih-Yuh Yang, San Jose, CA (US); Shibly S. Ahmed, San Jose, CA (US); Srikanteswara Dakshina-Murthy, Austin, TX (US); Cyrus E. Tabery, Sunnyvale, CA (US); Haihong Wang, Fremont, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/385,753

(22) Filed: Mar. 12, 2003

(51) Int. Cl.⁷ .......................................... H01L 21/8238
(52) U.S. Cl. ..................... 257/348; 257/347; 257/349; 257/350; 257/351; 257/352; 257/353; 257/354; 257/366; 257/368; 257/401
(58) Field of Search ................................ 257/213, 288, 257/302, 329, 347–354, 366, 368, 401, E21.564

(56) References Cited

U.S. PATENT DOCUMENTS 6,475,890 B1 * 11/2002 Yu .............................. 438/574
6,642,090 B1 * 11/2003 Fried et al. .................. 438/164

OTHER PUBLICATIONS

Digh Hisamoto et al., "FinFET–A Self–Aligned Double–Gate MOSFET Scalable to 20 nm," IEEE Transactions on Electron Devices, vol. 47, No. 12, Dec. 2000, pp. 2320–2325.
Yang–Kyu Choi et al., "Sub–20nm CMOS FinFET Technologies," 2001 IEEE, IEDM, pp. 421–424.
Xuejue Huang et al., "Sub–50 nm P–Channel FinFET," IEEE Transactions on Electron Devices, vol. 48, No. 5, May 2001, pp. 880–886.
Xuejue Huang et al., "Sub 50–nm FinFET; PMOS," 1999 IEEE, IEDM, pp. 67–70.
Yang–Kyu Choi et al., "Nanoscale CMOS Spacer FinFET for the Terabit Era," IEEE Electron Device Letters, vol. 23, No. 1, Jan. 2002, pp. 25–27.

* cited by examiner

*Primary Examiner*—Minhloan Tran
*Assistant Examiner*—Thomas L Dickey
(74) *Attorney, Agent, or Firm*—Harrity & Snyder, LLP (57) ABSTRACT

A method for forming a fin structure on a silicon-on-insulator (SOI) wafer that includes a silicon layer on an insulating layer that is formed over a semiconductor substrate includes etching the silicon layer using a first etch procedure, etching, following the first etch procedure, the silicon layer using a second etch procedure, and etching, following the second etch procedure, the silicon layer using a third etch procedure to form a T-shaped fin structure.

5 Claims, 8 Drawing Sheets

METHOD FOR FORMING A FIN IN A FINFET DEVICE

FIELD OF THE INVENTION

The present invention relates generally to semiconductor manufacturing and, more particularly, to forming fins in FinFET devices.

BACKGROUND OF THE INVENTION

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may be fabricated using layout and process techniques similar to those used for conventional planar MOSFETs.

SUMMARY OF THE INVENTION

Implementations consistent with the principles of the invention form a fin structure in a FinFET device. The fin structure is formed in the shape of a "T" through the use a selective etching process. The T-shaped fin structure allows a greater portion of the gate material to interface with the fin structure thereby improving device performance.

In accordance with the purpose of this invention as embodied and broadly described herein, a semiconductor device includes a substrate, an insulating layer formed on the substrate, a fin structure having a T-shaped cross-section that is formed on a portion of the insulating layer, and a gate formed on the insulating layer and surrounding the T-shaped fin structure.

In another implementation consistent with the present invention, a method for forming a fin structure in a FinFET device is provided. The method includes forming a first dielectric layer on a silicon-on-insulator (SOI) wafer that includes a silicon layer on an insulating layer that is formed over a semiconductor substrate, etching the first dielectric layer, and etching the silicon layer to form a T-shaped fin structure, where the etching includes a first etch, a second etch, and a third etch.

In yet another implementation consistent with the principles of the invention, a method for forming a fin structure on a SOI wafer that includes a silicon layer on an insulating layer that is formed over a semiconductor substrate is provided. The method includes etching the silicon layer using a first etch procedure, etching, following the first etch procedure, the silicon layer using a second etch procedure, and etching, following the second etch procedure, the silicon layer using a third etch procedure to form a T-shaped fin structure.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention form a fin structure in a FinFET device. The fin structure is formed in the shape of a "T" through the use of a selective etching process. The T-shaped fin structure allows a greater portion of the gate material to interface with the fin structure, thereby improving device performance. This is an important step for achieving a "round gate" FinFET structure, which provides effective control over transistor leakage and relax body thickness scaling requirements.

Exemplary Processing

Figure 1:
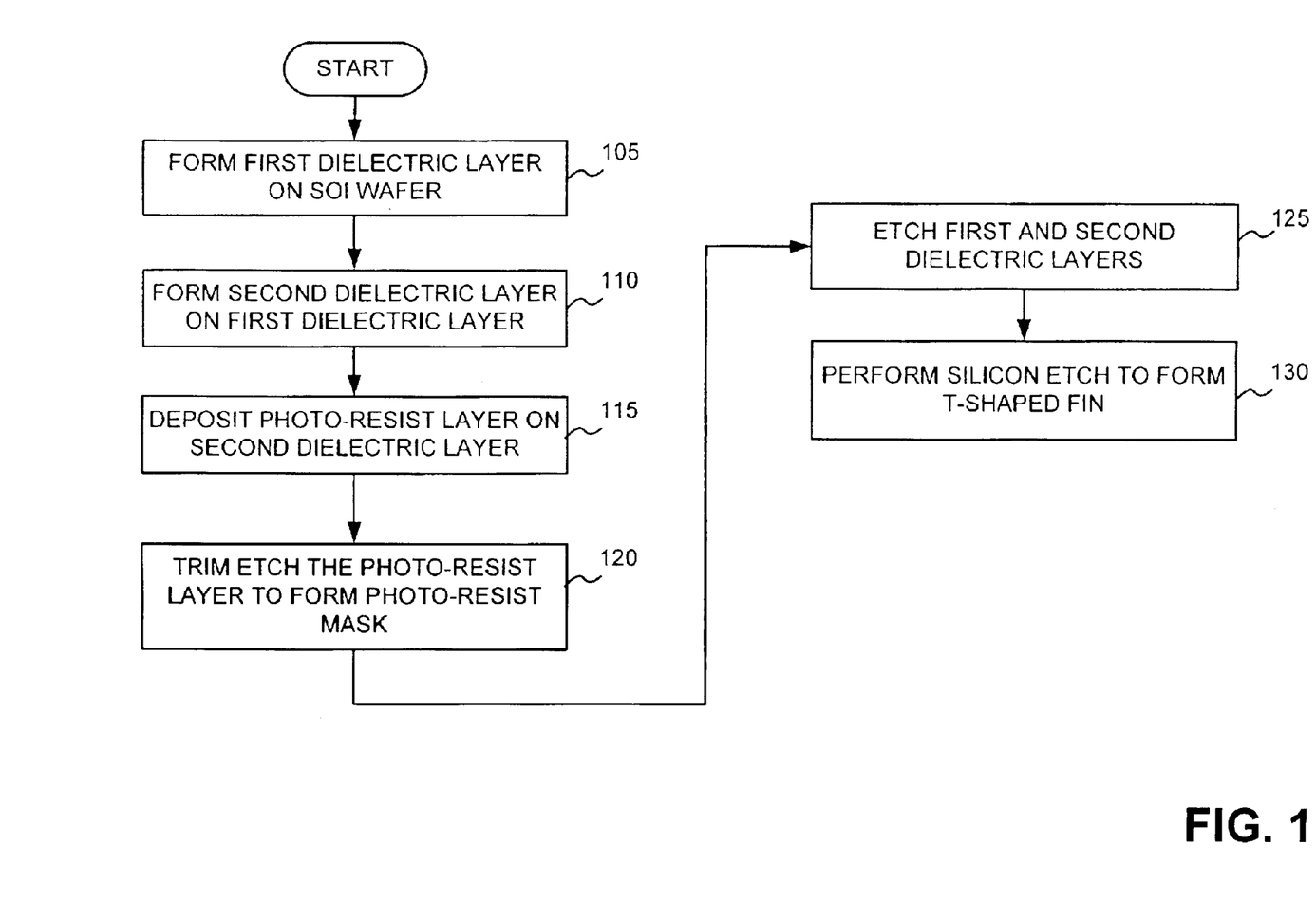
FIG. 1 illustrates an exemplary process for forming a FinFET device in an implementation consistent with the principles of the invention.

FIG. 1 illustrates an exemplary process for fabricating a FinFET device in an implementation consistent with the principles of the invention. FIGS. 2–5 illustrate exemplary views of a FinFET fabricated according to the processing described in FIG. 1. The fabrication of a single FinFET device will be described hereinafter. It will be appreciated, however, that the techniques described herein are equally applicable to forming more than one device.

Figure 2:
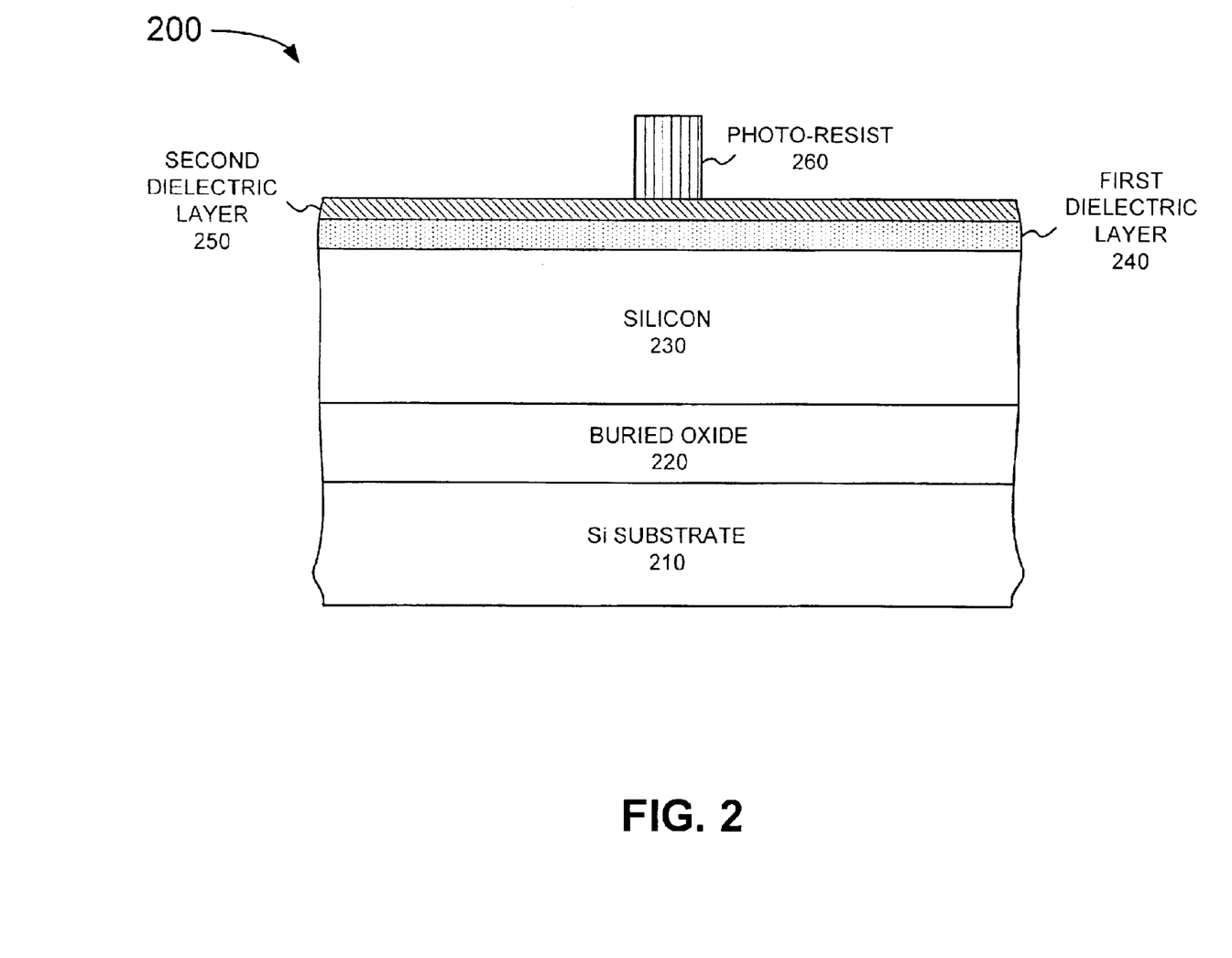
FIGS. 2–5 illustrate exemplary views of a FinFET device fabricated according to the processing described in FIG. 1.

With reference to FIGS. 1 and 2, processing may begin by forming a first dielectric layer 240 on a silicon-on-insulator (SOI) structure that includes a silicon substrate 210, a buried oxide layer 220, and a silicon layer 230 on the buried oxide layer 220 (act 105). Buried oxide layer 220 and silicon layer 230 may be formed on substrate 210 in a conventional manner.

In an exemplary implementation, buried oxide layer 220 may include a silicon oxide and may have a thickness ranging from about 1500 Å to about 3000 Å. Silicon layer 230 may include monocrystalline or polycrystalline silicon having a thickness ranging from about 200 Å to about 1000 Å. Silicon layer 230 is used to form a fin structure for a FinFET device, as described in more detail below.

In alternative implementations consistent with the present invention, substrate 210 and layer 230 may comprise other semiconducting materials, such as germanium, or combinations of semiconducting materials, such as silicon-germanium. Buried oxide layer 220 may also include other dielectric materials.

First dielectric layer 240 may be formed over silicon layer 230 to act as a protective cap during subsequent etching processes. In an exemplary implementation, first dielectric layer 240 may include a silicon oxide, such as $SiO_2$, deposited at a thickness ranging from about 15 Å to about 400 Å. A second dielectric layer 250 may then be formed over first dielectric layer 240 to act as a second protective cap or an anti-reflective coating (ARC) layer for patterning during subsequent etching processes (act 110). In an exemplary implementation, second dielectric layer 250 may include a silicon nitride, such as SiN or $Si_3N_4$, deposited to a thickness ranging from about 100 Å to about 800 Å.

Next, a photo-resist material may be deposited on dielectric layer 250 (act 115). The photo-resist material may be deposited in a conventional manner. Photo-resist material may then be patterned to form a photo-resist mask 260 for subsequent processing (act 120). The photo-resist material may be patterned in any conventional manner, such as via a trim etch, to form photo-resist mask 260. For example, the photo-resist material may be patterned and trimmed to form a photo-resist mask 260 designed to achieve a small width (e.g., from about 100 Å to about 1000 Å) associated with the subsequently formed fin.

First and second dielectric layers 240 and 250 may then be etched with the etching terminating at silicon layer 230 (act 125). In an exemplary implementation, first and second dielectric layers 240 and 250 may be etched using a fluorine chemistry, such as $CF_4$.

Next, a silicon etch may be performed on silicon layer 230 with the etching terminating at buried oxide layer 220 (act 130). In an exemplary implementation, the silicon etch may include a three step etching process. An initial anisotropic etching process may be performed to etch through approximately 70–80% of the thickness of the silicon layer 230. This initial etching process may be referred to as a "main etch." During this etching, the non-etched portion of silicon layer 230 will maintain a relatively straight profile. The etch chemistry, particular flow rates, power ranges, bias voltages, etch duration and other parameters associated with the main etch may be optimized based on the thickness of silicon layer 230 and the particular device requirements. In an exemplary implementation consistent with the principles of the invention, the main etch may involve providing a $Cl_2$/$HBr$/$CF_4$/$He$—$O_2$ etch chemistry with a gas flow ratio of approximately 100:60, a pressure of about 3 milli-Tesla (mT) to 30 mT, and a source power range of about 300 watts to about 600 watts, and bias power range of about 50 watts to 100 watts.

A second isotropic etch process may be used to further etch silicon layer 230 and form a fin structure. This second etching process may be referred to as a "soft-landing etch." The etch chemistry, particular flow rates, power ranges, bias voltages, etch duration and other parameters associated with the soft-landing etch may be optimized based on the thickness of silicon layer 230 and the particular device requirements. In an exemplary implementation consistent with the principles of the invention, the soft-landing etch may involve providing an $HBr$/$He$—$O_2$ etch chemistry with a gas flow ratio of approximately 15:1, a pressure of about 5 mT to 20 mT, and a source power range of about 500 watts to about 1000 watts and a bias power range of about 5 to about 50 watts.

Figure 3:
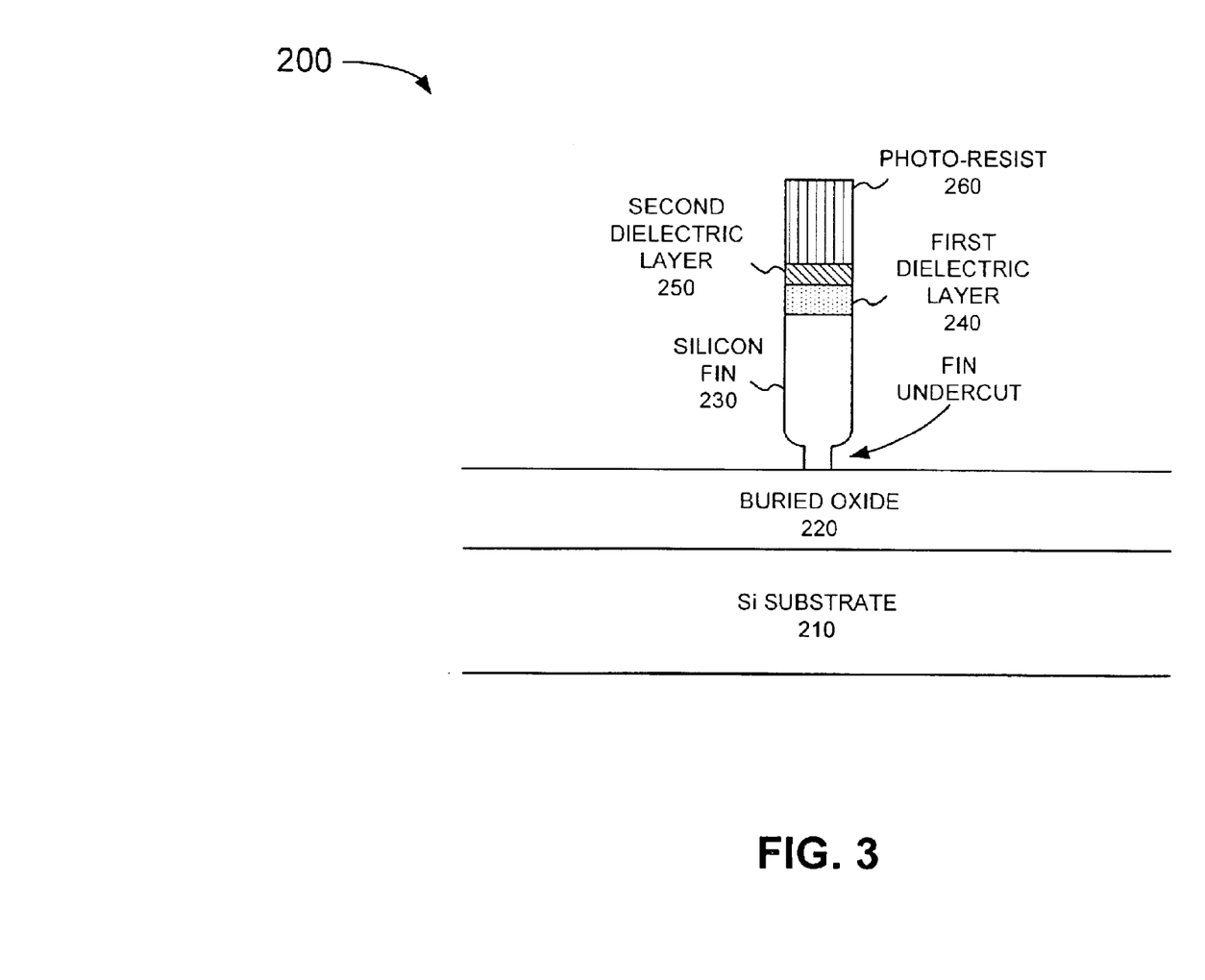

A third etch process may be used to further etch silicon layer 230 and undercut silicon fin 230, as illustrated in FIG. 3, to form a T-shaped configuration. This third etching process may be referred to as an "overetch." The etch chemistry, particular flow rates, power ranges, bias voltages, etch duration and other parameters associated with the overetch may be optimized based on the particular device requirements. In an exemplary implementation consistent with the principles of the invention, the overetch may involve providing an $HBr$/$He$—$O_2$ etch chemistry with a gas flow ratio of approximately 20:1, a pressure of about 50 mT to 100 mT, and a source power range of about 800 watts to about 1500 watts and a bias power range of about 60 to 120 watts.

For a more isotropic etch, $Cl_2$ may be added to the soft-landing and overetch processes to better control the fin undercut. The width of silicon fin 230 at the undercut region may range from about 90 Å to about 300 Å, while the width at the upper region of silicon fin 230 may range from about 150 Å to about 500 Å. Other gas combinations may alternatively be used for the main etch, soft-landing etch, and overetch, as will be understood by those skilled in the art. In addition, one or more of the three etchings may be combined in alternative implementations. In each case, however, the resulting fin 230 has a T-shaped cross-section at the channel region.

After the formation of fin 230, photo-resist 260 may be removed and conventional fabrication processing can be performed to complete the FinFET device. For example, a gate dielectric may be formed on the side surfaces of fin 230. Source/drain regions may then be formed at the respective ends of fin 230, followed by formation of one or more gates. In an exemplary implementation, the gate material may include polysilicon deposited using conventional chemical vapor deposition (CVD) to a thickness ranging from about 500 Å to about 1500 Å. Alternatively, other semiconducting materials, such as germanium or combinations of silicon and germanium, or various metals may be used as the gate material. The gate material may then be patterned and etched to form the gate electrodes.

Figure 4:
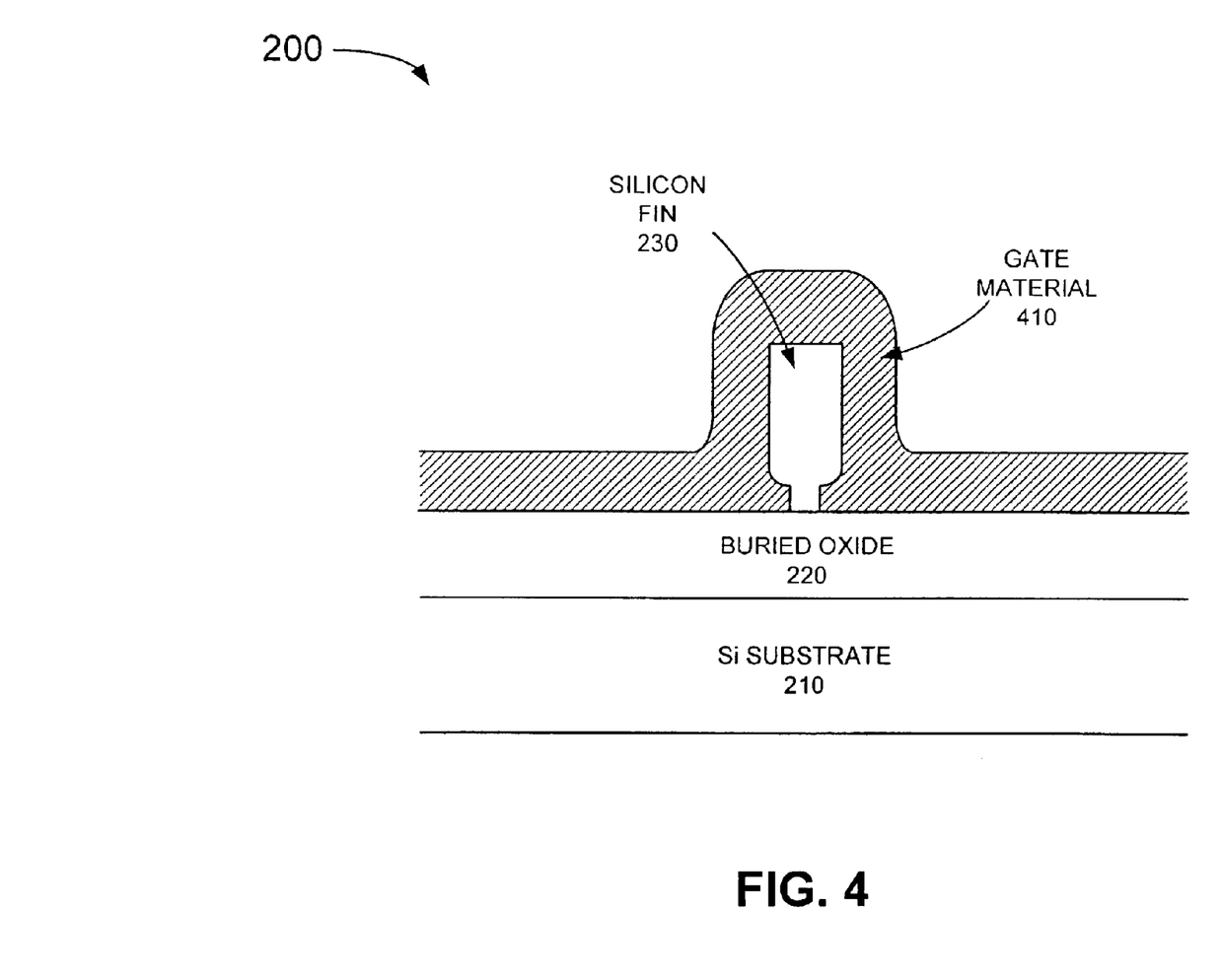

FIG. 4 illustrates an exemplary cross-sectional view of a semiconductor device consistent with the principles of the invention after the gate material 420 has been deposited. As illustrated in FIG. 4, the T-shaped configuration of fin structure 230 allows for a greater portion of gate material 410 to interface with fin 230. It should be noted that the gate dielectric and protective dielectric layer(s) are not illustrated in FIG. 4 for simplicity.

Figure 5:
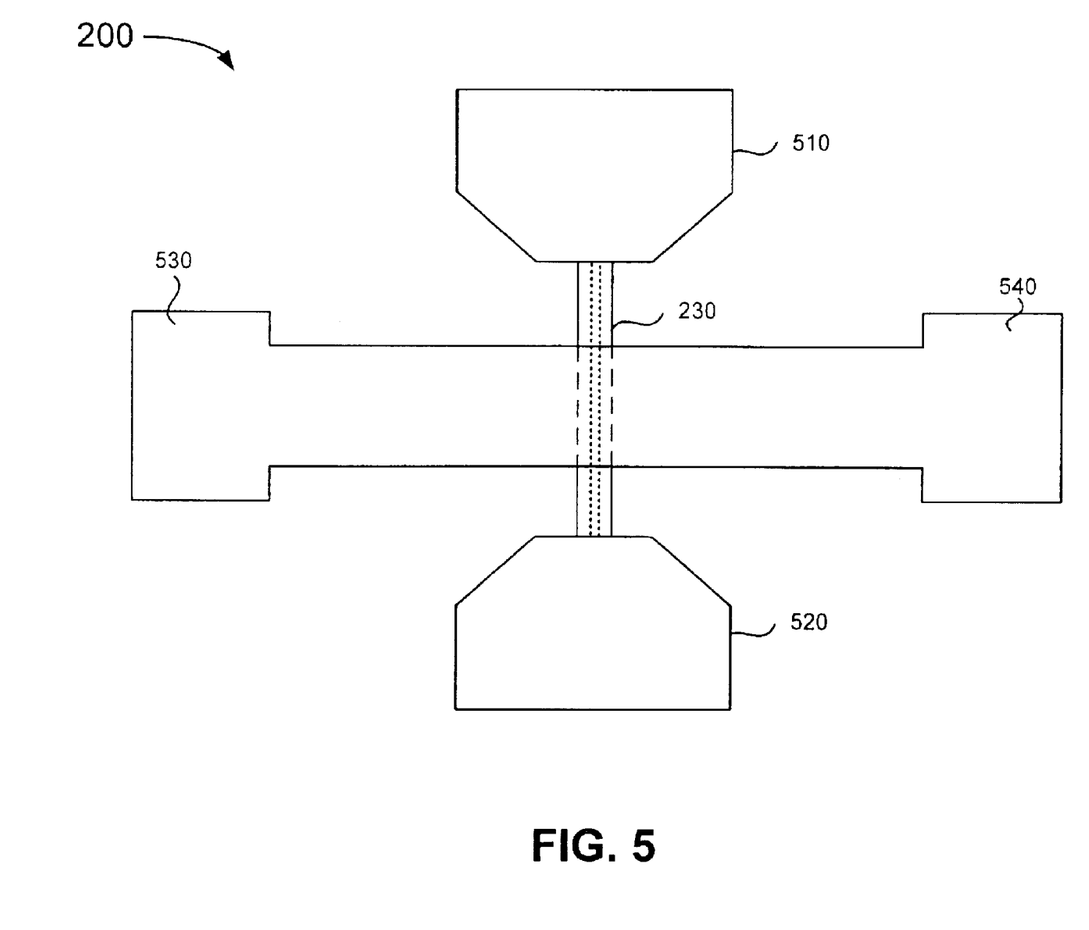

FIG. 5 illustrates a top view of semiconductor device 200 consistent with the principles of the invention after the source/drain regions and gate electrodes are formed. As illustrated, semiconductor device 200 may include a double-gate structure with fin 230, source drain regions 510 and 520, and gate electrodes 530 and 540. The dotted lines in FIG. 5 illustrate fin structure 230 and the thinned (i.e., undercut) portion of fin structure 230.

The source/drain regions 510 and 520 may then be doped with n-type or p-type impurities based on the particular end device requirements. In addition, sidewall spacers may optionally be formed prior to the source/drain ion implantation to control the location of the source/drain junctions based on the particular circuit requirements. Activation annealing may then be performed to activate the source/drain regions 510 and 520.

Thus, in accordance with the present invention, a double-gate FinFET device may be formed with a T-shaped fin structure that allows for a greater portion of the gate material to interface with the fin structure. Advantageously, the resulting structure exhibits improved performance. In addition, the present invention provides increased flexibility and can be easily integrated into conventional processing.

Additional Implementation

Figure 6:
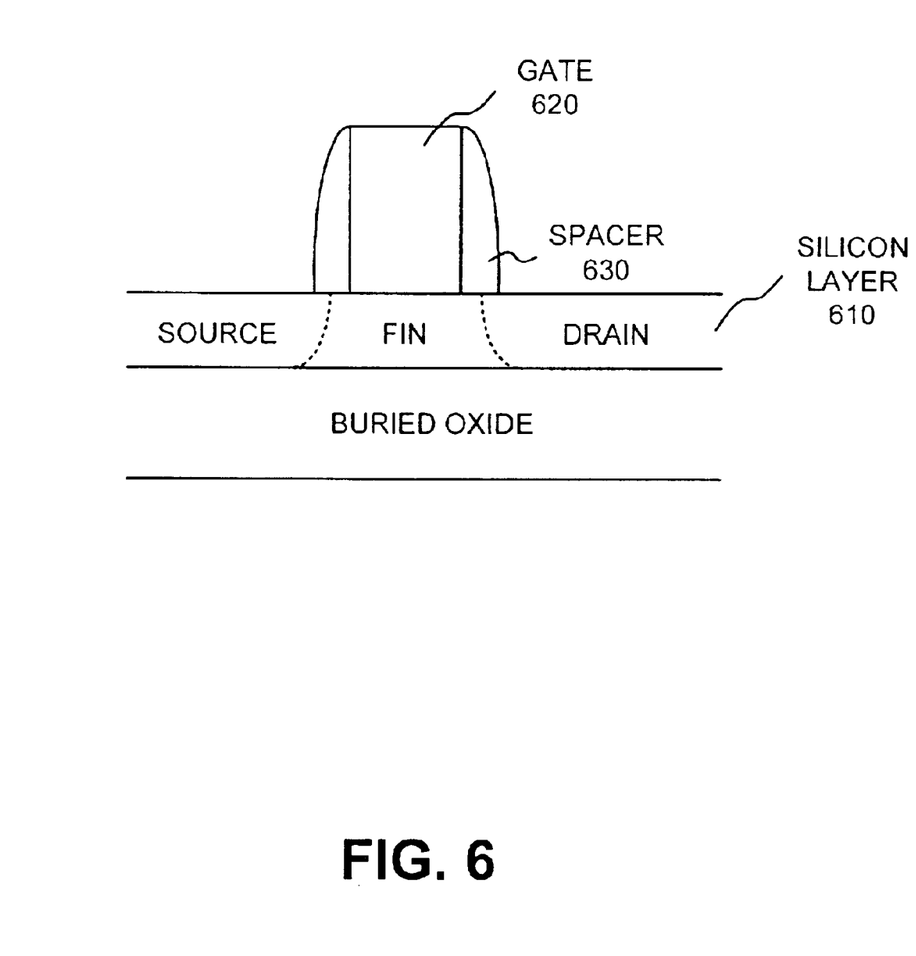
FIGS. 6–8 illustrate exemplary views of a vertically-uniform doped source-drain junction in accordance with another implementation of the present invention.
Figure 7:
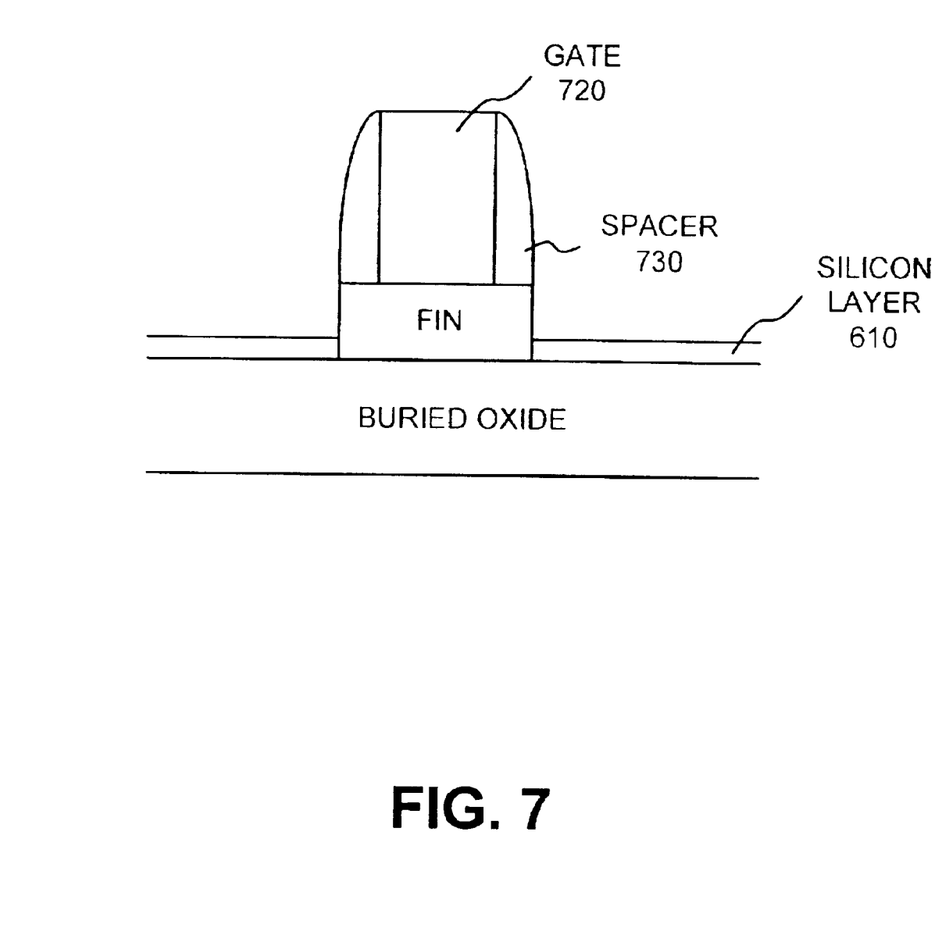
Figure 8:
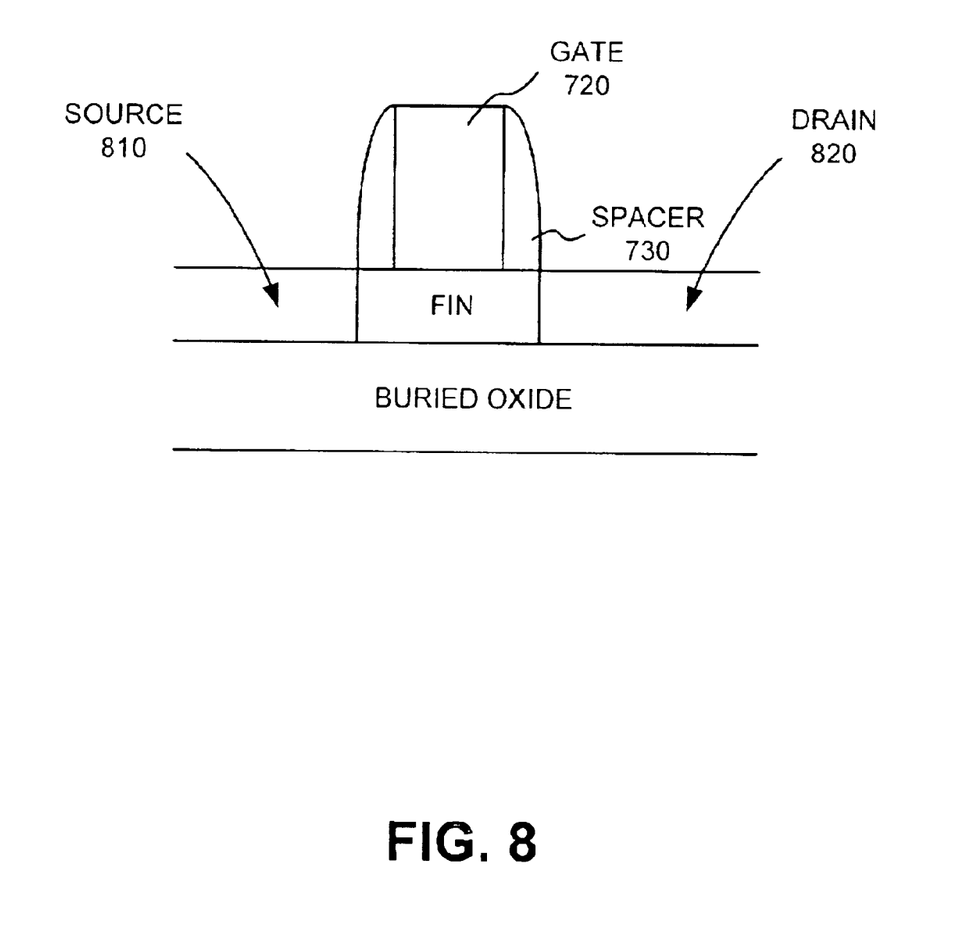

In other implementations, a FinFET with a vertically-uniform doped source-drain junction may be desired. FIGS. 6–8 illustrate exemplary views of forming a vertically-uniform doped source-drain junction in accordance with another implementation of the present invention. A gate 620 and spacers 630 may be formed on a silicon layer 610 over a buried oxide layer. Silicon layer 610 may be formed into a fin structure and may further include source and drain regions.

The source and drain regions of silicon layer 610 may then be etched, as illustrated in FIG. 7. In one implementation, the etching of the source and drain regions may terminate prior to reaching the buried oxide layer. The source region 810 and drain region 820 may be filled via, for example, a doped epitaxial growth of the silicon in silicon layer 610, as illustrated in FIG. 8. In this manner, the source/drain junction may be uniformly doped in the vertical direction.

CONCLUSION

Implementations consistent with the principles of the invention form a T-shaped fin structure in a FinFET device, allowing for a greater portion of the gate material to interface with the fin structure. As a result, improved FinFET device performance can be achieved.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used.

The scope of the invention is defined by the claims and their equivalents.

What is claimed is:

1. A semiconductor device, comprising:
   a substrate;
   an insulating layer formed on the substrate;
   a fin structure having a T-shaped cross-section and being formed on a portion of the insulating layer, the fin structure including a lower portion and an upper portion, wherein a width of the upper portion of the fin structure ranges from about 150 Å to 600 Å and a width of the lower portion of the fin structure ranges from about 90 Å to 300 Å; and
   a gate formed on the insulating layer and surrounding the T-shaped fin structure.

2. The semiconductor device of claim 1 wherein the gate comprises a polysilicon material.

3. The semiconductor device of claim 1 wherein the insulating layer comprises a buried oxide layer.

4. The semiconductor device of claim 1 wherein the fin structure comprises silicon, germanium or silicon-germanium.

5. A semiconductor device comprising:
   a fin structure comprising an upper portion and a lower portion, a width of the upper portion of the fin structure ranging from about 150 Å to 600 Å and a width of the lower portion of the fin structure ranging from about 90 Å to 300 Å; and
   a gate structure formed adjacent the fin structure.

* * * * *